United States Patent [19]
Lee et al.

[11] Patent Number: 6,154,416
[45] Date of Patent: Nov. 28, 2000

[54] COLUMN ADDRESS DECODER FOR TWO BIT PREFETCH OF SEMICONDUCTOR MEMORY DEVICE AND DECODING METHOD THEREOF

[75] Inventors: Jung-bae Lee; Si-yeol Lee, both of Kyungki-do, Rep. of Korea

[73] Assignee: Samsung Electronics Co., Ltd., Rep. of Korea

[21] Appl. No.: 09/409,178

[22] Filed: Sep. 30, 1999

[30] Foreign Application Priority Data

Oct. 2, 1998 [KR] Rep. of Korea ............. 98-41765

[51] Int. Cl.$^7$ .................................. G11C 8/00; G11C 7/00
[52] U.S. Cl. .................. 365/233; 365/230.06; 365/200
[58] Field of Search ..................... 368/233, 230.06, 368/200

[56] References Cited

U.S. PATENT DOCUMENTS

| | | | |
|---|---|---|---|
| Re. 36,089 | 2/1999 | Ooishi et al. | 365/189.01 |
| 5,255,228 | 10/1993 | Hatta et al. | 365/230.06 |
| 5,282,173 | 1/1994 | Miyaji et al. | 365/230.03 |
| 5,315,548 | 5/1994 | Ooishi et al. | 365/189.01 |
| 5,594,704 | 1/1997 | Konishi et al. | 365/233 |
| 5,781,493 | 7/1998 | Kobayashi | 365/230.06 |
| 5,798,978 | 8/1998 | Yoo et al. | 365/230.06 |
| 5,815,460 | 9/1998 | Watanabe | 365/230.06 |
| 5,815,462 | 9/1998 | Konishi et al. | 365/233 |
| 5,822,268 | 10/1998 | Kirihata | 365/230.03 |
| 5,870,347 | 2/1999 | Keeth et al. | 365/230.03 |
| 5,880,995 | 3/1999 | Kobatake | 365/185.23 |
| 5,896,342 | 4/1999 | Nakao | 365/230.06 |
| 5,896,345 | 4/1999 | Sohn | 365/230.06 |
| 5,901,105 | 5/1999 | Ong et al. | 365/230.06 |
| 6,026,036 | 2/2000 | Sekiya et al. | 365/233 |
| 6,064,625 | 5/2000 | Tomita | 365/200 |

OTHER PUBLICATIONS

Steven A. Przybylski, *New DRAM Technologies*, pp. 219–222, 1996.

U.S. application No. 09/170,940, Hwang, Oct. 13, 1998.

*Primary Examiner*—Trong Phan
*Attorney, Agent, or Firm*—Myers Bigel Sibley & Sajovec

[57] ABSTRACT

A column address decoder for two bit prefetch of a semiconductor device and a decoding method thereof are provided. The column address decoder includes a memory cell array having a plurality of memory cells for storing data and redundancy memory cells for replacing poor memory cells, a plurality of bit lines connected to the memory cells, a plurality of input and output lines, a plurality of switching means connected between the bit lines and the input and output lines. It also includes an even predecoder for receiving the less significant bits of the address received as input from the outside and predecoding the less significant bits in which the least significant bit is '0' of the less significant bits, an inverting decoder for reproducing the less significant bits of the external address corresponding to the address predecoded by the even predecoder, and a redundancy enable signal generating portion for generating a redundancy enable signal for receiving the output of the inverting decoder and activating one of the redundancy memory cells. According to the present invention, the data processing speed of the semiconductor memory device is increased.

22 Claims, 8 Drawing Sheets

COLUMN ADDRESS DECODER FOR TWO BIT PREFETCH OF SEMICONDUCTOR MEMORY DEVICE AND DECODING METHOD THEREOF

BACKGROUND OF THE INVENTION

1. Field of the Invention

The present invention relates to a semiconductor memory device, and more particularly, to a column address decoder for a two bit prefetch and decoding method thereof.

2. Description of the Related Art

A semiconductor memory device includes a memory cell array for storing data. The memory cell array includes a plurality of memory cells connected to m word lines and n bit lines. The n bit lines are connected to input and output lines through n column selecting line gates. One of the m word lines and one of the n column selecting line gates are selected in order to read the data stored in the memory cell array. The data of the memory cell connected to the selected word line is loaded onto the bit lines. The data loaded onto the bit lines is loaded onto the input and output lines through the selected column selecting line gates. The data loaded onto the input and output lines is output to the outside through an input and output pad.

According to the conventional technology, one item of data is read from or written into the memory cell array by activating one column selecting line gate at a time. However, as the operating speed of a system using the semiconductor memory device (for example, a central processing unit CPU) becomes higher, it is required that the data processing speed of the semiconductor memory device is improved. Therefore, a method of increasing the amount of simultaneously transmitted data is used when data is written to the memory cell array or is read from the memory cell array in order to increase the operating speed of the semiconductor memory device. By increasing the amount of simultaneously transmitted data, the data processing speed of the semiconductor memory device can be increased.

SUMMARY OF THE INVENTION

It is a first objective of the present invention to provide a semiconductor memory device for reading or writing two items of data simultaneously by inputting one address.

It is another objective of the present invention to provide a column address decoding method for increasing the amount of data which is input to and output from a memory cell array.

Accordingly, to achieve the first objective, there is provided a semiconductor memory device, comprising a memory cell array including a plurality of memory cells for storing data, a plurality of bit line pairs connected to the memory cells, a plurality of input and output line pairs, a plurality of switching means connected between the bit line pairs and the input and output line pairs, and an address decoder for decoding addresses received as input from the outside, simultaneously activating at least two switching means among the plurality of switching means, and electrically connecting corresponding bit lines and input and output lines.

To achieve the first objective, there is also provided a semiconductor memory device, comprising a memory cell array including a plurality of memory cells for storing data and redundancy memory cells for replacing poor memory cells among the memory cells, a plurality of bit line pairs connected to the memory cells, a plurality of input and output line pairs, a plurality of switching means connected between the bit line pairs and the input and output line pairs, an even predecoder for receiving as input the less significant bits of the address input from the outside and predecoding the less significant bits when the least significant bit is '0', an inverting decoder for reproducing the less significant bits of the external address corresponding to the address predecoded by the even predecoder, and a redundancy enable signal generating portion for generating a redundancy enable signal for receiving the output of the inverting decoder and activating one of the redundancy memory cells.

To achieve the second objective, there is provided a method of decoding the column address of the semiconductor memory device including a plurality of bit line pairs, a plurality of input and output line pairs, column selecting line gates for connecting the plurality of bit line pairs to the plurality of input and output line pairs, and a column address decoder for predecoding the column address received as input from the outside, comprising the steps of applying the column address from the outside to the column address decoder and simultaneously activating the column selecting line gate designated by the column address and the column selecting line gate designated by the address next to the column address.

According to the present invention, the data processing speed of the semiconductor memory device is increased.

BRIEF DESCRIPTION OF THE DRAWING(S)

The above objectives and advantages of the present invention will become more apparent by describing in detail a preferred embodiment thereof with reference to the attached drawings in which.

DESCRIPTION OF THE PREFERRED EMBODIMENTS

Hereinafter, the present invention will be described in detail with reference to the attached drawings.

Figure 1:
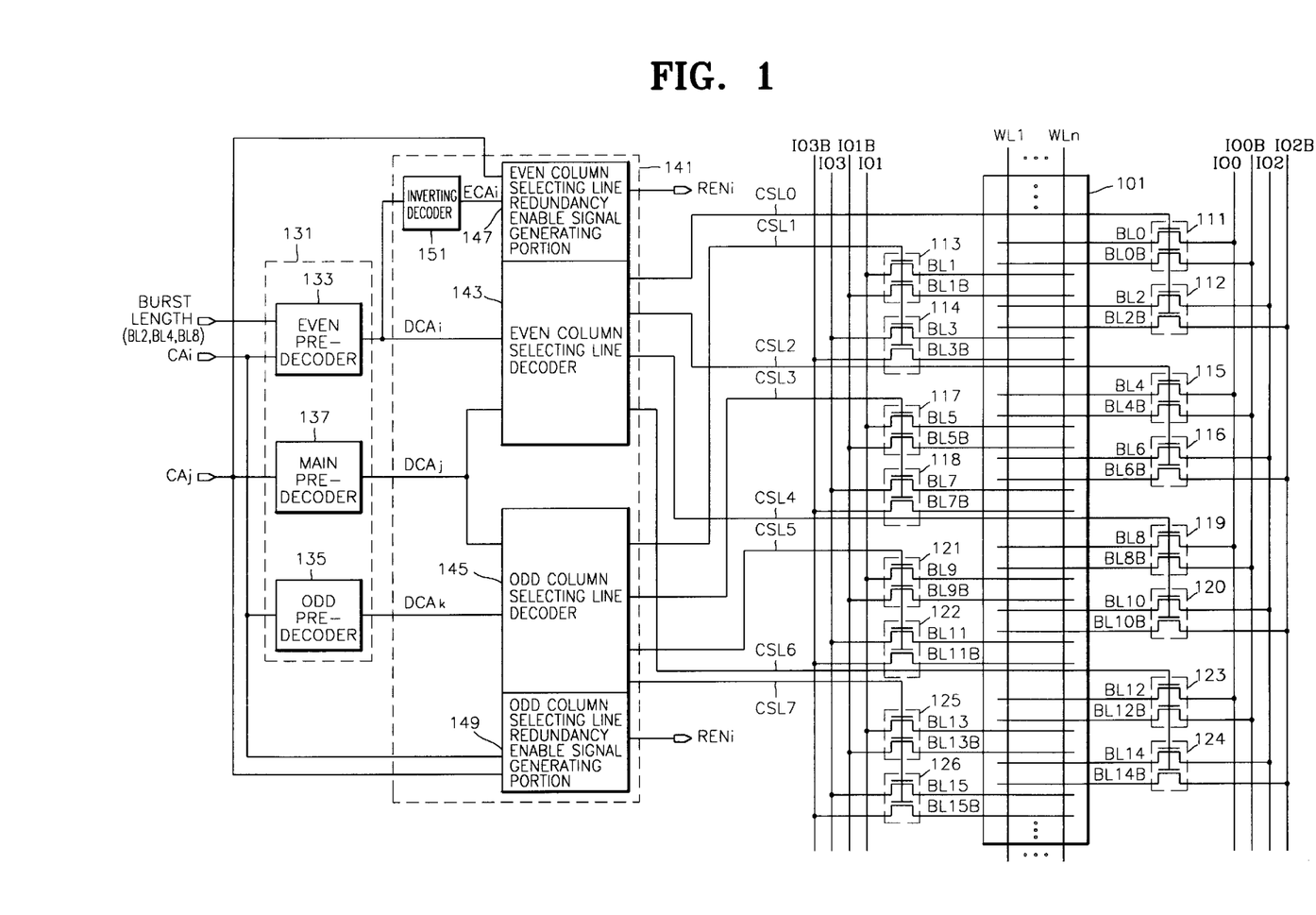
FIG. 1 schematically shows a semiconductor memory device according to a first embodiment of the present invention.

FIG. 1 schematically shows a semiconductor memory device according to a first embodiment of the present invention. Referring to FIG. 1, the semiconductor memory device according to the first embodiment includes a memory cell array 101, a plurality of bit line pairs BL0/BL0B through BL15/BL15B, a plurality of column selecting line gates 111 through 126, a plurality of input and output line pairs IO0/IO0B through IO3/IO3B, a plurality of column selecting lines CSL0 through CSL7, a predecoder 131, and a main decoder 141. The data stored in the memory cell array 101 is transmitted to the outside of the semiconductor memory device through input and output line pairs IO0/IO0B through IO3/IO3B. Data from the outside is stored in the memory cell array 101 through input and output line pairs IO0/IO0B through IO3/IO3B.

The predecoder 131 predecodes column addresses CAi and CAj received as input from the outside of the semiconductor memory device. The predecoder 131 includes an even predecoder 133, an odd predecoder 135, and a main predecoder 137. The even predecoder 133 and the odd predecoder 135 predecode the less significant bits CAi of the column addresses CAi and CAj. The even predecoder 133 predecodes even bits of the less significant bits CAi. The odd predecoder 135 predecodes odd bits of the less significant bits CAi. In the even bits, the least significant bit LSB is '0' of the less significant bits CAi. In the odd bits, the least significant bit LSB is '1' of the less significant bits CAi. The main predecoder 137 predecodes the most significant bits CAj of the column addresses CAi and CAj.

A main decoder 141 receives predecoded column addresses DCAi, DCAj, and DCAk from the predecoder 131, decodes the received column addresses, and activates two column selecting lines of the column selecting lines CSL0 through CSL7, i.e., one of the even column selecting lines CSL0, CSL2, CSL4, or CSL6 and one of the odd column selecting lines CSL1, CSL3, CSL5, or CSL7. The main decoder 141 includes an even column selecting line decoder 143, an odd column selecting line decoder 145, an even column selecting line redundancy enable signal generating portion 147, an odd column selecting line redundancy enable signal generating portion 149, and an inverting decoder 151. The even column selecting line decoder 143 receives column addresses DCAi and DCAj which are predecoded by the even predecoder 133 and the main predecoder 137, decodes the received column addresses, and activates one of the even column selecting lines CSL0, CSL2, CSL4, or CSL6. The odd column selecting line decoder 145 receives column addresses DCAj and DCAk which are predecoded by the odd predecoder 135 and the main predecoder 137, decodes the received column addresses, and activates one of the odd column selecting lines CSL1, CSL3, CSL5, or CSL7. The inverting decoder 151 receives the address DCAi predecoded by the even predecoder 133, inversely decodes the received address, and generates bits ECAi having the same logic levels as those of the less significant bits CAi of the column address.

The even column selecting line redundancy enable signal generating portion 147 and the odd column selecting line redundancy enable signal generating portion 149 operate only when there are poor memory cells in the memory cell array 101. Namely, when there are poor memory cells in the memory cell array 101, the even column selecting line redundancy enable signal generating portion 147 and the odd column selecting line redundancy enable signal generating portion 149 respectively generate a redundancy enable signal RENi for activating redundancy memory cells (not shown) replacing the poor memory cells. The even column selecting line redundancy enable signal generating portion 147 decodes the bits ECAi output from the inverting decoder 151 and the most significant bits CAj of the column address input from the outside and generates the redundancy enable signal RENi. The odd column selecting line redundancy enable signal generating portion 149 receives the less significant bits CAi and the most significant bits CAj of the column address as input from the outside, decodes the received bits, and generates the redundancy enable signal RENi.

The plurality of column selecting line gates 111 through 126 respectively include NMOS transistors. They are controlled by voltages generated in the even column selecting lines CSL0, CSL2, CSL4, and CSL6 and the odd column selecting lines CSL1, CSL3, CSL5, and CSL7 and has switching functions that respectively combine the plurality of bit line pairs BL0/BL0B through BL15/BL15B with the plurality of input and output line pairs IO0/IO0B through IO3/IO3B. For example, when a predetermined voltage is generated in the column selecting line CSL0 by the even column selecting line decoder 143, the column selecting line gates 111 and 112 are activated. Accordingly, the pair of bit lines BL0/BL0B are electrically connected to the pair of input and output lines IO0/IO0B. Also, the pair of bit lines BL2/BL2B are electrically connected to the pair of input and output lines IO2/IO2B.

The memory cell array 101 includes a plurality of memory cells (not shown). The word lines WL0 through WLn and the pairs of bit lines BL0/BL0B through BL15/BL15B are connected to the plurality of memory cells. Even column selecting line gates 111, 112, 115, 116, 119, 120, 123, and 124 and pairs of even input and output lines IO0/IO0B and IO2/IO2B are arranged on one side of the memory cell array 101. Odd column selecting line gates 113, 114, 117, 118, 121, 122, 125, and 126 and pairs of odd input and output lines IO1/IO1B and IO3/IO3B are arranged on the other side of the memory cell array 101. Namely, referring to FIG. 1, the odd column selecting line gates 113, 114, 117, 118, 121, 122, 125, and 126 and the pairs of odd input and output lines IO1/IO1B and IO3/IO3B are arranged on the left side of the memory cell array 101. The even column selecting line gates 111, 112, 115, 116, 119, 120, 123, and 124 and the pairs of even input and output lines IO0/IO0B and IO2/IO2B are arranged on the right side of the memory cell array 101. It is possible to separately mask data on the left side and right side of the memory cell array 101 during an odd or even data masking, by separately arranging the even column selecting line gates 111, 112, 115, 116, 119, 120, 123, and 124 and odd column selecting line gates 113, 114, 117, 118, 121, 122, 125, and 126. Accordingly, control can be easily performed.

The circuit shown in FIG. 1 is generally used with a synchronous DRAM semiconductor device which operates in synchronization with a clock signal.

The operation of the semiconductor memory device shown in FIG. 1 will be described below. One of the word lines WL1 through WLn is selected by a row address input from the outside during a read operation of the semiconductor memory device. For example, assuming that the word line WL1 is selected, the data stored in the memory cells connected to the word line WL1 is loaded onto the bit lines pairs BL0/BL0B through BL15/BL15B. When column addresses CAi and CAj are received as input from the outside of the semiconductor memory device, the column addresses CAi and CAj are decoded by the predecoder 131 and the main decoder 141, and activate one of the even column selecting lines CSL0, CSL2, CSL4, or CSL6, and one of the odd column selecting line gates CSL1, CSL3, CSL5, or CSL7. For example, when the column addresses CAi and CAj input from the outside designate the column selecting line CSL0, the column selecting line gates 111 and 112 are activated. The column selecting line gates 113 and 114 are simultaneously activated. When the column addresses CAi and CAj designate the column selecting line CSL1, the column selecting line gates 113 and 114 are activated. The column selecting line gates 115 and 116 are simultaneously activated. At this time, the burst length is at least four. The data loaded onto the corresponding bit line pairs through the activated column selecting line gates is transmitted to the outside through the corresponding input and output line pairs.

The writing operation of the semiconductor memory device is performed in the reverse order of the reading operation.

Though one column address consisting of CAi and CAj is input, the amount of data input to and output from the memory cell array 101 is doubled since the main decoder 141 simultaneously activates the column selecting line designated by the column address and the column selecting line designated by the next column address. Therefore, the data processing speed of the semiconductor memory device is increased.

Figure 2:
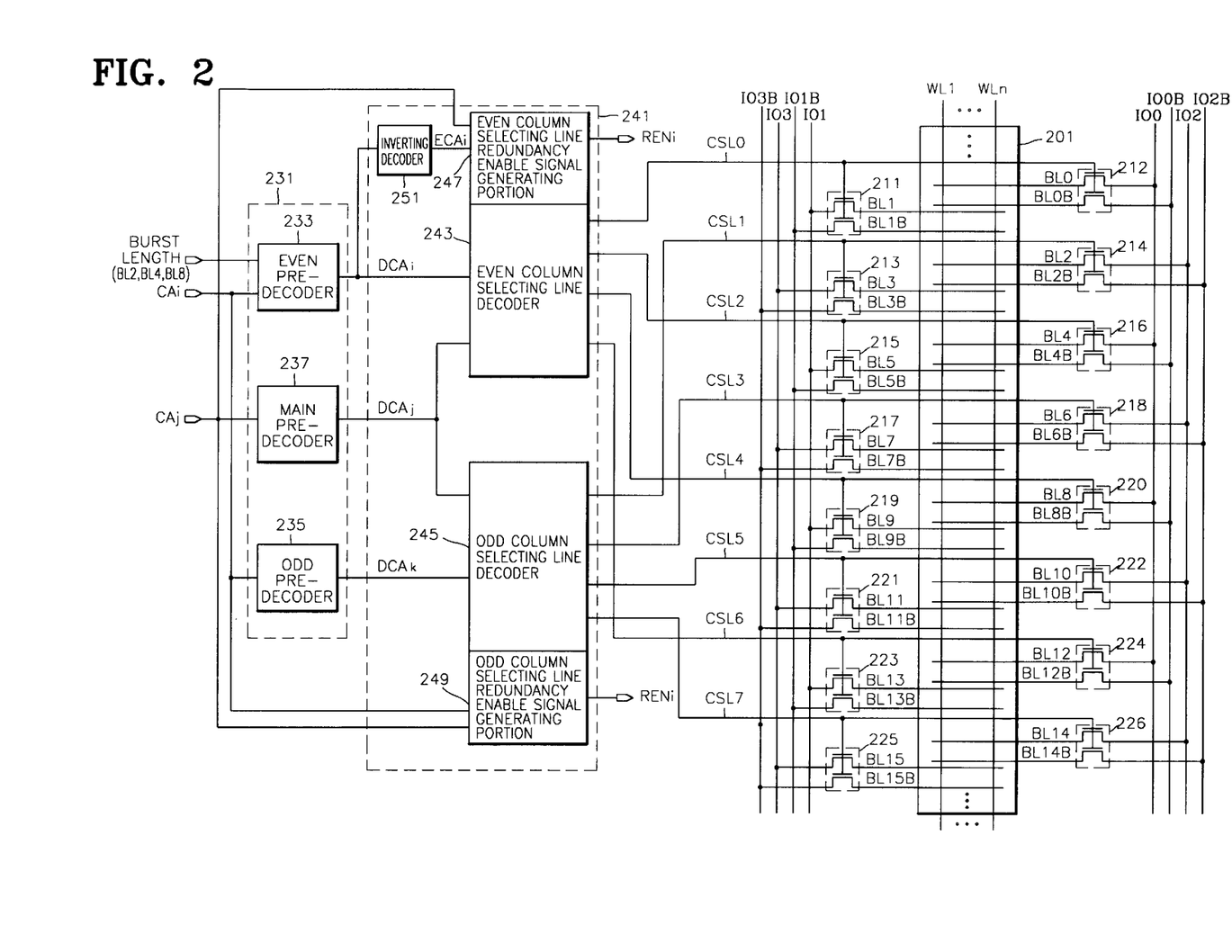
FIG. 2 schematically shows a semiconductor memory device according to a second embodiment of the present invention.

FIG. 2 schematically, shows a semiconductor memory device according to a second embodiment of the present invention. Referring to FIG. 2, the semiconductor memory device according to the second embodiment of the present invention includes a memory cell array 201, a plurality of bit line pairs BL0/BL0B through BL15/BL15B, a plurality of input and output line pairs IO0/IO0B through IO3/IO3B, a plurality of column selecting lines CSL0 through CSL7, a plurality of column selecting line gates 211 through 226, a predecoder 231, and a main decoder 241.

The structures and the operations of the memory cell array 201, the plurality of bit line pairs BL0/BL0B through BL15/BL15B, the plurality of input and output line pairs IO0/IO0B through IO3/IO3B, the plurality of column selecting lines CSL0 through CSL7, the predecoder 231, and the main decoder 241, which are shown in FIG. 2 are the same as those of the memory cell array 101, the plurality of bit line pairs BL0/BL0B through BL15/BL15B, the plurality of input and output line pairs IO0/IO0B through IO3/IO3B, the plurality of column selecting lines CSL0 through CSL7, the predecoder 131, and the main decoder 141 of FIG. 1 respectively.

FIG. 2 is different from FIG. 1 in that the even column selecting line gates 211, 212, 215, 216, 219, 220, 223, and 224 connected to the even column selecting lines CSL0, CSL2, CSL4, and CSL6, and the odd column selecting line gates 213, 214, 217, 218, 221, 222, 225, and 226 connected to the odd column selecting lines CSL1, CSL3, CSL5, and CSL7 are evenly arranged on both sides of the memory cell array 201. The structures of the column selecting line gates shown in FIGS. 1 and 2 can be selectively used according to the characteristic of the semiconductor memory device.

Figure 3:
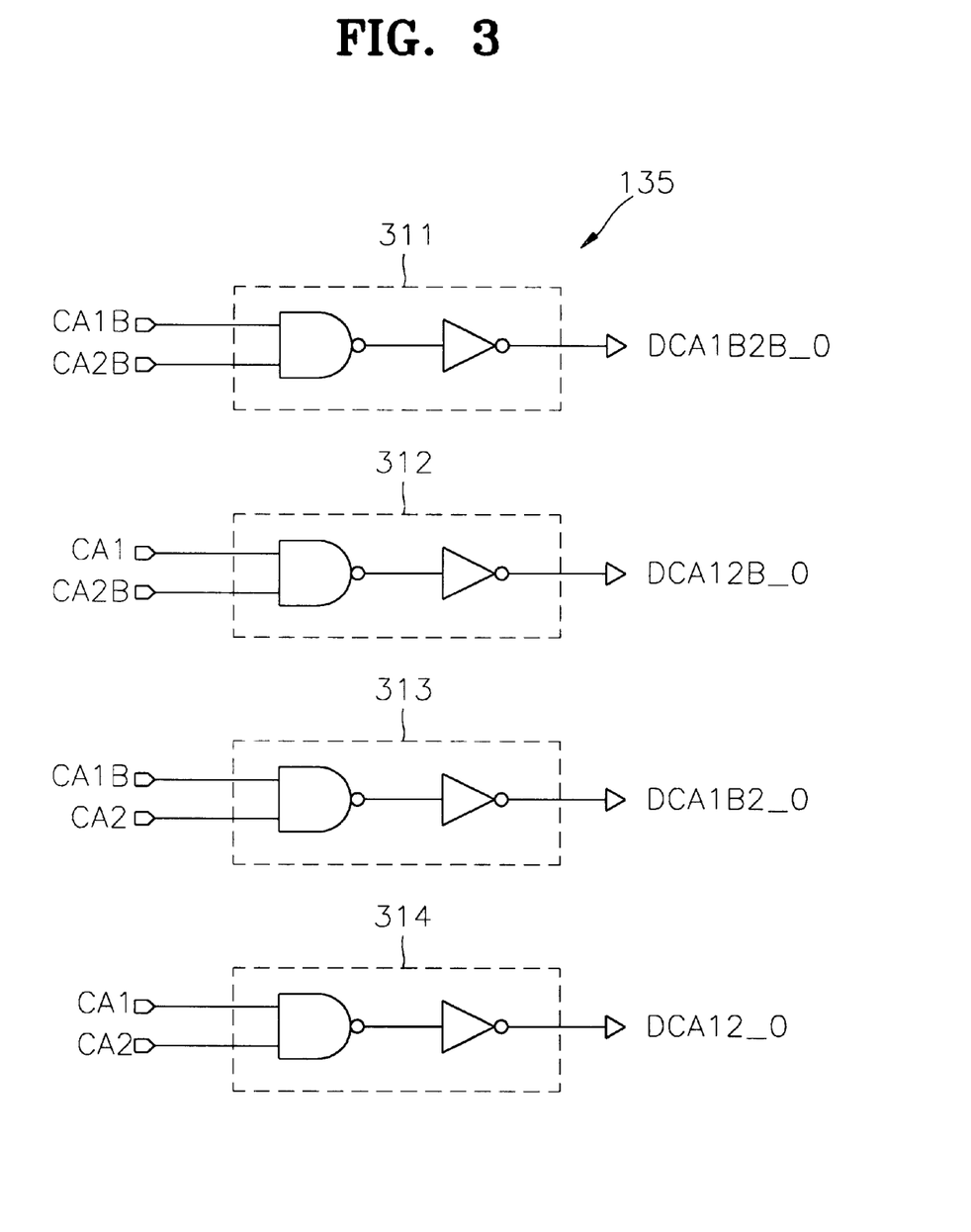
FIG. 3 is a detailed circuit diagram of the odd predecoder shown in FIG. 1

FIG. 3 is a detailed circuit diagram of the odd predecoder 135 shown in FIG. 1. Referring to FIG. 3, the odd predecoder 135 receives the second least significant bit CA1, the third least significant bit CA2, and inversed bits CA1B and CA2B of the second and third less significant bits CA1 and CA2 of the less significant bits of the column address CAi, combines the above bits with each other, and generates decoded column addresses DCA1B2B_O, DCA12B_O, DCA1B2_O, and DCA12_O. The odd predecoder 135 includes first through fourth decoding units 311 through 314.

The first decoding unit 311 receives the inversed bits CA1B and CA2B of the second and third less significant bits CA1 and CA2 of the column address CAi, performs an AND operation on the inversed bits, and generates the decoded column address DCA1B2B_O. The second decoding unit 312 receives the second least significant bit CA1 and the inversed bit CA2B of the third least significant bit CA2, performs an AND operation on the above bits, and generates the decoded column address DCA12B_O. The third decoding unit 313 receives the inversed bit CA1B of the second least significant bit CA1 and the third least significant bit CA2, performs an AND operation on the above bits, and generates the decoded column address DCA1B2_O. The fourth decoding unit 314 receives the second and third less significant bits CA1 and CA2 of the column address CAi, performs an AND operation on the above bits, and generates the decoded column address DCA12_O.

Figure 4:
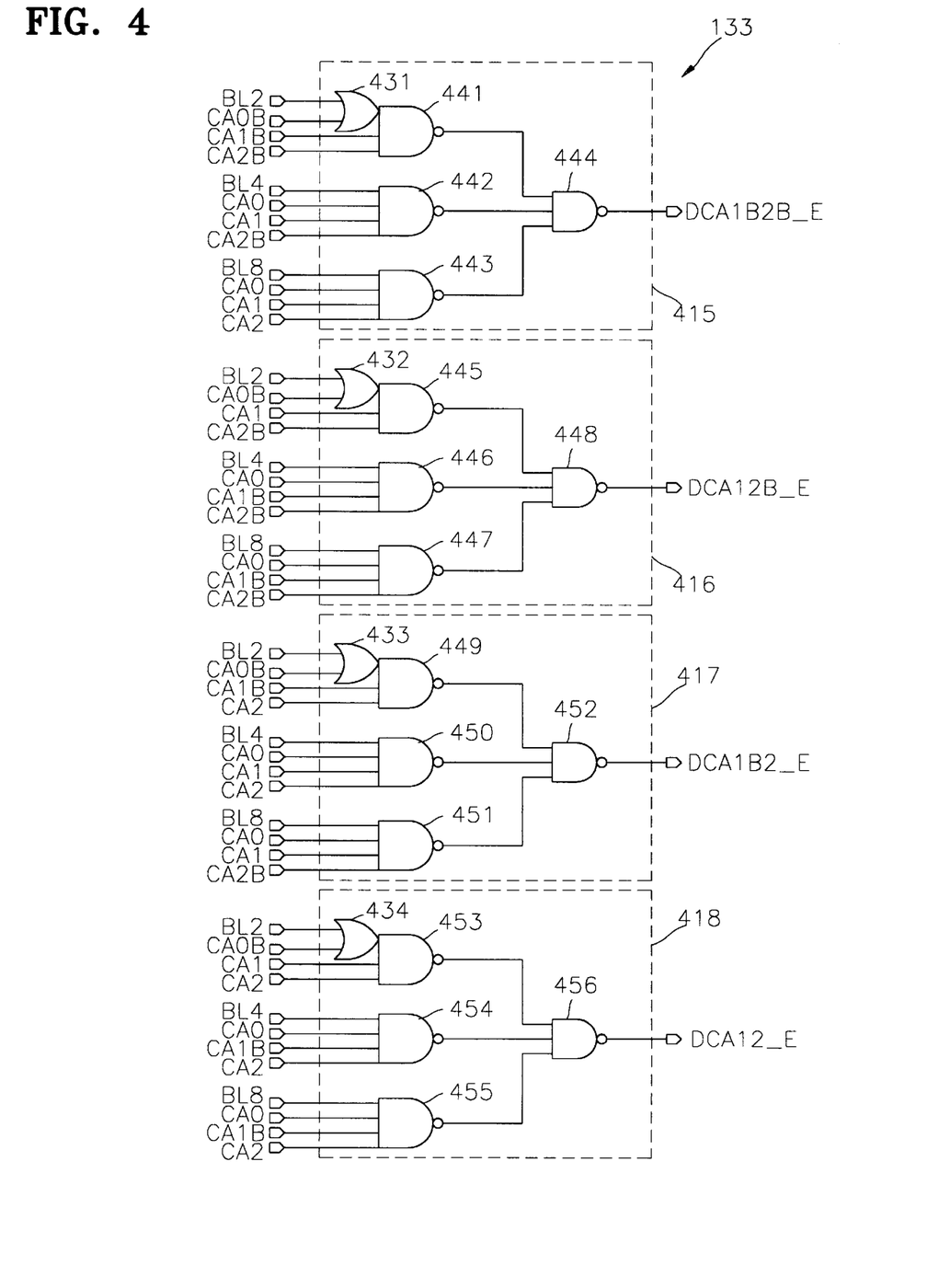
FIG. 4 is a detailed circuit diagram of the even predecoder shown in FIG. 1.

FIG. 4 is a detailed circuit diagram of the even predecoder 133 shown in FIG. 1. Referring to FIG. 4, the even predecoder 133 receives burst length signals BL2, BL4, and BL8, first through third less significant bits CA0, CA1, and CA2 of the column address CAi, and the inversed bits CA0B, CA1B, and CA2B of the less significant bits CA0, CA1 and CA2, combines the signals with the bits, and generates decoded column addresses DCA1B2B_E, DCA12B_E, DCA1B2_E, and DCA12_E. The even predecoder 133 includes fifth through eighth decoding units 415 through 418. The fifth decoding unit 415 includes an OR gate 431 and NAND gates 441 through 444. The fifth decoding unit 415 receives the burst length signals BL2, BL4, and BL8 and the less significant bits CA0, CA1, CA2, CA0B, CA1B, and CA2B of the column address CAi, combines the signals with the bits, and outputs the decoded column address DCA1B2B_E. For example, when the burst length is 4, the first and second less significant bits CA0 and CA1 of the column address CAi are respectively '1', and the third least significant bit CA2 is '0', the output of the NAND gate 442 becomes '0'. Accordingly, the decoded column address DCA1B2B_E is activated to '1'.

The sixth decoding unit 416 includes an OR gate 432 and NAND gates 445 through 448. The sixth decoding unit 416 receives the burst length signals BL2, BL4, and BL8 and the less significant bits CA0, CA1, CA0B, CA1B, and CA2B of the column address CAi, combines the signals with the bits, and generates a decoded column address DCA12B_E. The seventh decoding unit 417 includes an OR gate 433 and NAND gates 449 through 452. The seventh decoding unit 417 receives the burst length signals BL2, BL4, and BL8 and the less significant bits CA0, CA1, CA2, CA0B, CA1B, and CA2B of the column address CAi, combines the signals with the bits, and generates a decoded column address DCA1 B2_E. The eighth decoding unit 418 includes an OR gate 434 and NAND gates 453 through 456. The eighth decoding unit 418 receives the burst length signals BL2, BL4, and BL8 and the less significant bits CA0, CA1, CA2, CA0B, and CA1B of the column address CAi, combines the signals with the bits, and generates a decoded column address DCA12_E. The function of the predecoder 131 is shown in Tables 1 through 3.

TABLE 1

| BL = 2 | | | |
|---|---|---|---|
| CA2 | CA1 | CA0 | Decoded column addresses which are activated |
| 0 | 0 | 0 | DCA1B2B_E and DCA1B2B_O |
| 0 | 0 | 1 | DCA1B2B_O and DCA1B2B_E |

As shown in Table 1, the column selecting signals DCA1B2B_E and DCA1B2B_O are simultaneously activated regardless of the logic level of the least significant bit when the burst length BL is 2.

TABLE 2

BL = 4

| CA2 | CA1 | CA0 | Decoded column addresses which are activated |
|---|---|---|---|
| 0 | 0 | 0 | DCA1B2B_E and DCA1B2B_O |
| 0 | 0 | 1 | DCA1B2B_O and DCA12B_E |
| 0 | 1 | 0 | DCA12B_E and DCA12B_O |
| 0 | 1 | 1 | DCA12B_O and DCA1B2B_E |

As shown in Table 2, even though one column address CAi is input, one of the decoded column addresses DCA1B2B_E, DCA12B_E, DCA1B2_E, and DCA12_E and one of the decoded column addresses DCA1B2B_O, DCA12B_O, DCA1B2_O, and DCA12_O are simultaneously activated. Therefore, the column selecting line designated by one column address CAi and the column selecting line designated by the next column address are simultaneously activated. For example, when column address information 000 is input, column selecting lines CSL0 and CSL1 are activated. Accordingly, the column selecting line gates 111, 112, 113, and 114 of FIG. 1 are simultaneously activated. Also, when address information 011 is input, the column selecting line CSL3 is activated. Accordingly, the column selecting line gates 117 and 118 of FIG. 1 are activated. The column selecting line gates 111 and 112 of FIG. 1, designated by address information 000 after address information 011 (011 is the final address when the burst length is 4), are activated.

TABLE 3

BL = 8

| CA2 | CA1 | CA0 | Decoded column addresses which are activated |
|---|---|---|---|
| 0 | 0 | 0 | DCA1B2B_E and DCA1B2B_O |
| 0 | 0 | 1 | DCA1B2B_O and DCA12B_E |
| 0 | 1 | 0 | DCA12B_E and DCA12B_O |
| 0 | 1 | 1 | DCA12B_O and DCA1B2_E |
| 1 | 0 | 0 | DCA1B2_E and DCA1B2_O |
| 1 | 0 | 1 | DCA1B2_O and DCA12_E |
| 1 | 1 | 0 | DCA12_E and DCA12_O |
| 1 | 1 | 1 | DCA12_O and DCA1B2B_E |

Table 3 is different from Table 2 in that the column selecting line CSL7 of FIG. 1, designated by address information 111, and the column selecting line CSL0 of FIG. 1, designated by address information 000 after address information 111, are simultaneously activated when the column address CAi is received as 111.

According to the above-mentioned present invention, when either one of the column address CAi or CAj is input, the column selecting line designated by the column address is activated. The column selecting line designated by the address next to the column address is simultaneously activated. Therefore, the amount of data input to and output from the memory cell array is doubled.

Figure 5:
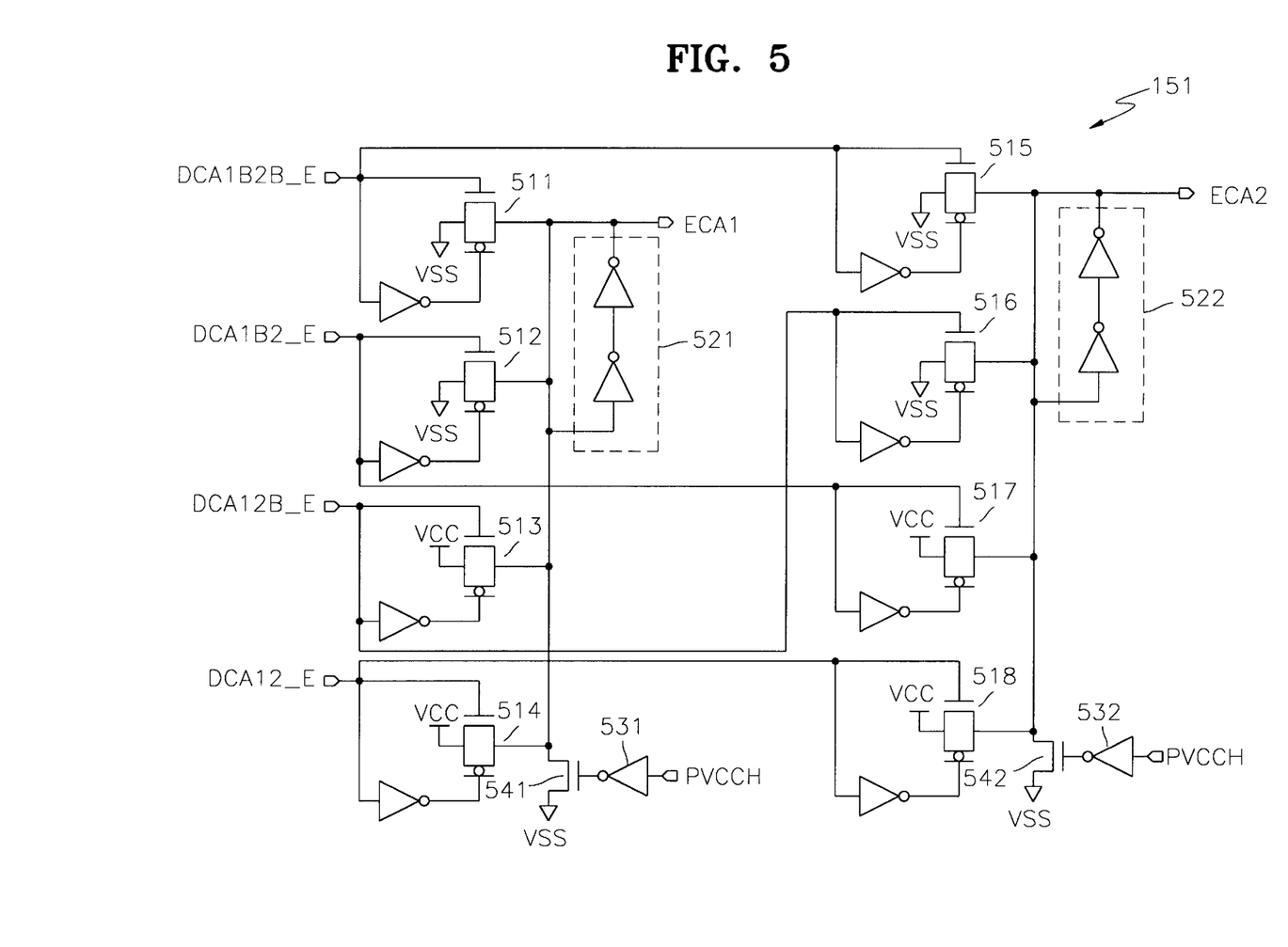
FIG. 5 is a detailed circuit diagram of the inverting decoder shown in FIG. 1.

FIG. 5 is a circuit diagram of the inverting decoder shown in FIG. 1. Referring to FIG. 5, the inverting decoder 151 outputs bits ECA1 and ECA2 which are the same as the less significant bits CA1 and CA2 of the column address input from the outside in response to the predecoded column addresses DCA1B2B_E, DCA12B_E, DCA1B2_E, and DCA12_E shown in FIG. 4. The inverting decoder 151 includes transmission gates 511 through 518, latches 521 and 522, inverters 531 and 532, and NMOS transistors 541 and 542.

A ground voltage VSS is applied to input ports of the transmission gates 511, 512, 515, and 516. A power voltage VCC is applied to input ports of the transmission gates 513, 514, 517, and 518. The transmission gates 511 and 512 are activated and output the ground voltage VSS when the decoded column addresses DCA1B2B_E and DCA1B2_E are logic high and are deactivated when the decoded column addresses DCA1B2B_E and DCA1B2_E are logic low. The transmission gates 513 and 514 are activated and output the power voltage VCC when the decoded column addresses DCA12B_E and DCA12_E are logic high and are deactivated when the decoded column addresses DCA12B_E and DCA12_E are logic low. Therefore, the bit ECA1 becomes logic low when either the decoded column address DCA1B2B_E or the decoded column address DCA1B2_E is logic high, and becomes logic high when either the decoded column address DCA12B_E or the decoded column address DCA12_E is logic high.

The transmission gates 515 and 516 are activated and output the ground voltage VSS when the decoded column addresses DCA1 B2B_E and DCA12B_E are logic high and are deactivated when the decoded column addresses DCA1B2B_E and DCA12B_E are logic low. The transmission gates 517 and 518 are activated and output the power voltage VCC when the decoded column addresses DCA1B2_E and DCA12_E are logic high, and are deactivated when the decoded column addresses DCA1B2_E and DCA12_E are logic high. Therefore, the bit ECA2 becomes logic low when either the decoded column address DCA1B2B_E or the decoded column address DCA12B_E is logic high, and becomes logic high when either the decoded column address DCA1B2_E or the decoded column address DCA12_E is logic high.

The latches 521 and 522 respectively latch the bits ECA1 and ECA2. The invertors 531 and 532 invert a power voltage sensing signal PVCCH and apply the signal to the gates of the NMOS transistors 541 and 542. The power voltage sensing signal PVCCH is maintained at logic low when the power voltage VCC is no more than a predetermined voltage level and is maintained at logic high when the power voltage VCC is not less than the predetermined voltage level. Therefore, when the power voltage VCC is no more than the predetermined voltage level, the NMOS transistors 541 and 542 are turned on and the bits ECA1 and ECA2 are maintained at logic low. When the power voltage VCC becomes more than the predetermined voltage level, the NMOS transistors 541 and 542 are turned off. Therefore, the bits ECA1 and ECA2 are dependent on the outputs of the transmission gates 511 through 518.

Figure 6:
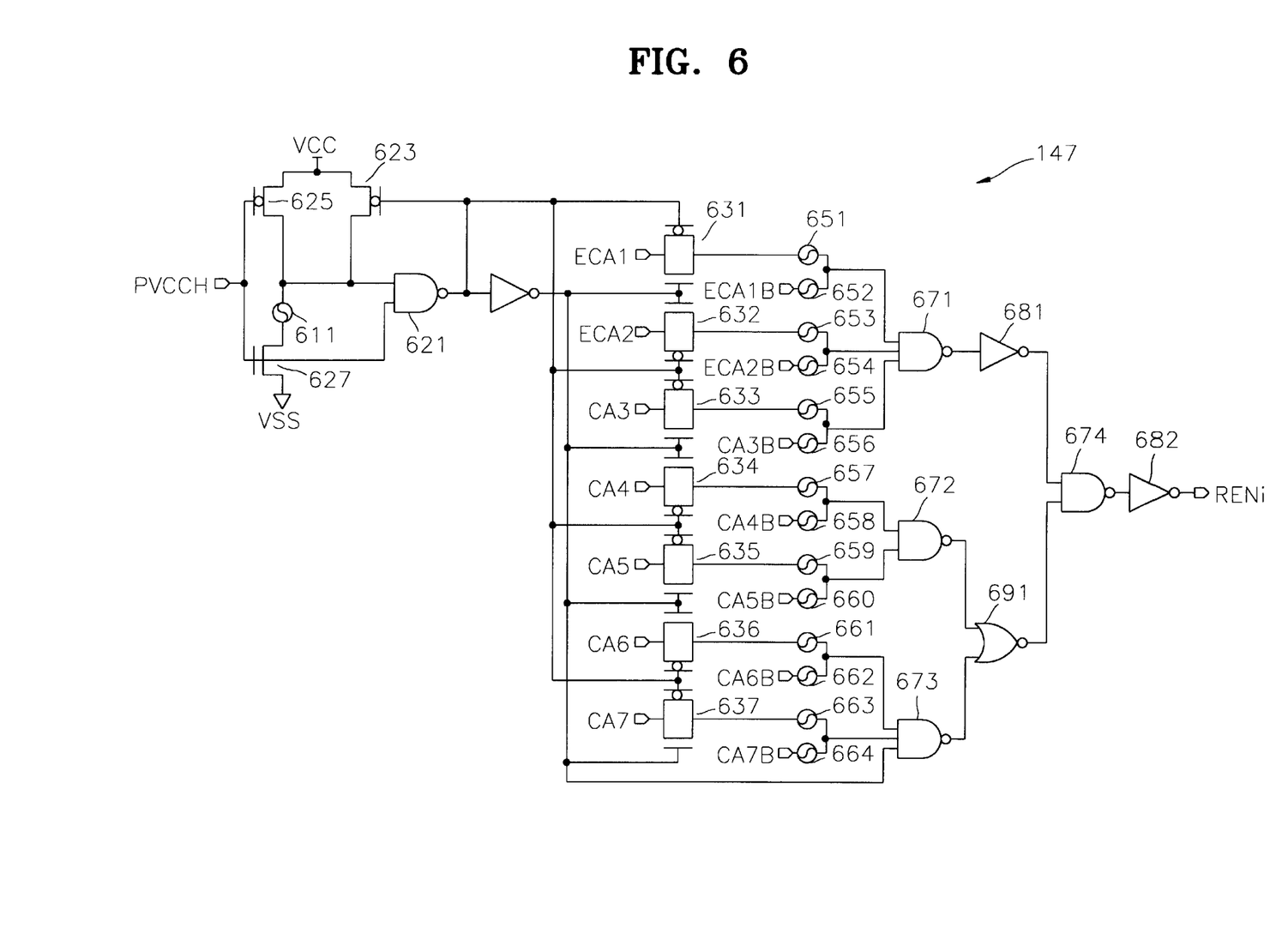
FIG. 6 is a detailed circuit diagram of the even column selecting line redundancy enable signal generating portion shown in FIG. 1.

FIG. 6 is a circuit diagram of an even column selecting line redundancy enable signal generating portion shown in FIG. 1. Referring to FIG. 6, a redundancy enable signal generating portion 147 receives the bits ECA1 and ECA2 generated and output from the inverting decoder, the inverted bits ECA1B and ECA2B of the bits ECA1 and ECA2, most significant bits CA3 through CA7 of the column address CAi input from the outside, the inverted bits CA3B through CA7B of the most significant bits CA3 through CA7, and the power voltage sensing signal PVCCH, and generates a redundancy enable signal RENi for selecting the redundancy memory cell. The power voltage sensing signal PVCCH is maintained at logic low when the power voltage VCC is no more than the predetermined voltage level and is maintained at logic high when the power voltage VCC is not less than the predetermined voltage level. The output of a NAND gate 621 is maintained at logic high with a fuse 611 activated. Accordingly, transmission gates 631 through 638 are turned off, thus not generating the redundancy enable signal RENi. Therefore, the fuse 611 is cut in order to activate the redundancy enable signal generating portion 147.

When the power voltage VCC is applied with the fuse 611 cut, the output of the NAND gate 621 becomes logic low. Accordingly, a PMOS transistor 623 is turned on and the output of the NAND gate 621 is maintained at logic low. When the output of the NAND gate 621 is logic low, the transmission gates 631 through 638 are turned on. Therefore, the redundancy enable signal RENi is generated according to the programming of fuses 651 through 664. Namely, the bits ECA1 and ECA2, the inverted bits ECA1B and ECA2B of the bits ECA1 and ECA2, the significant bits CA3 through CA7 of the column address, and the inverted bits CA3B through CA7B of the significant bits CA3 through CA7 are combined by logic circuits 671 through 674, 681, 682, and 691 and are generated as the redundancy enable signal RENi. A PMOS transistor 625 and an NMOS transistor 627 operate as invertors for inverting the power voltage sensing signal PVCCH.

According to the even column selecting line redundancy enable signal generating portion shown in FIG. 6, when one column address CAi is received as input to the predecoder 131 shown in FIG. 1, and in the case that one of the memory cells connected to the column selecting line designated by the address next to the column address CAi is poor, the redundancy memory cell which replaces the poor memory cell is precisely selected by the column address CAi and the bits ECAi.

Figure 7:
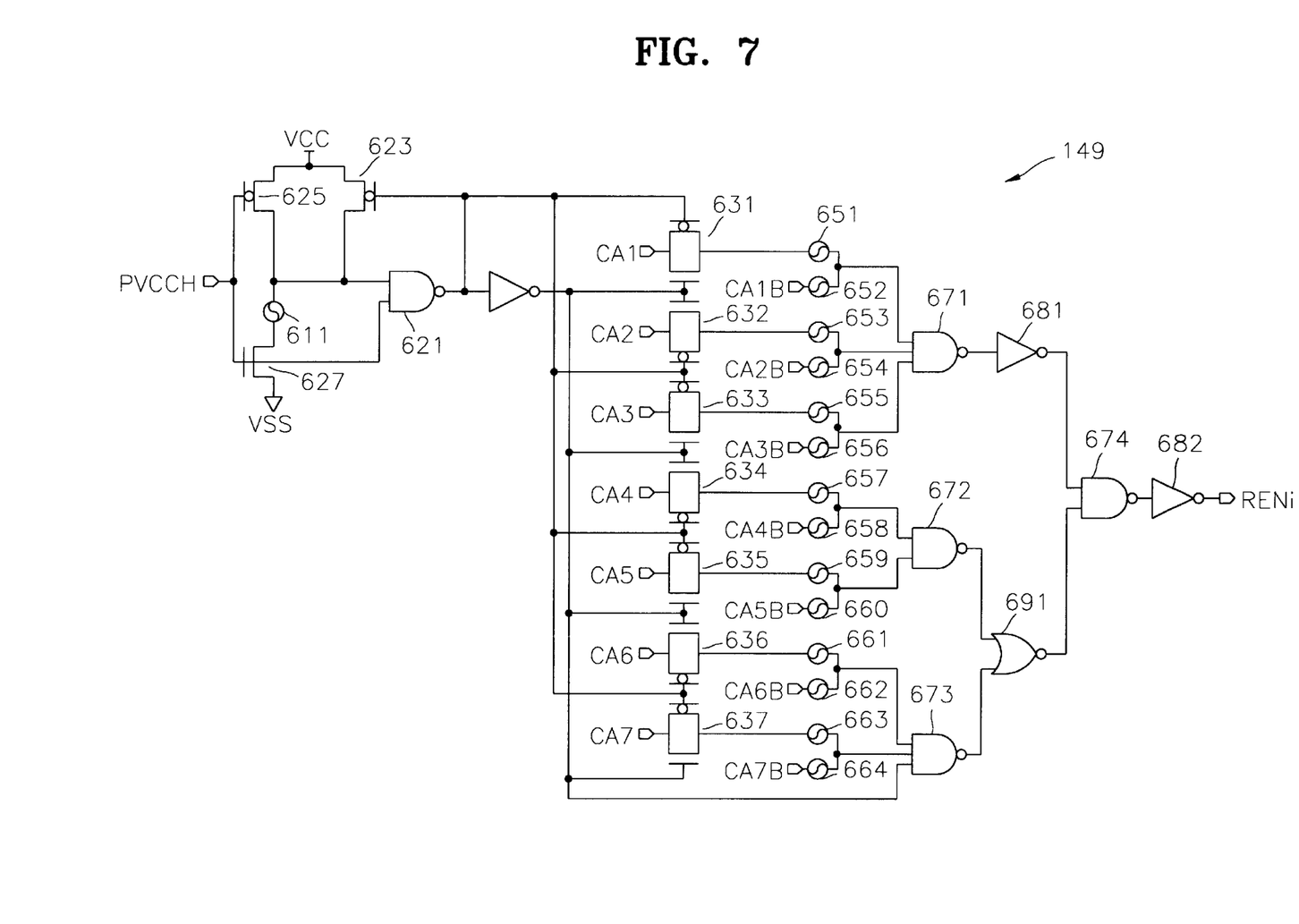
FIG. 7 is a detailed circuit diagram of the odd column selecting line redundancy enable signal generating portion shown in FIG. 1.

FIG. 7 is a circuit diagram of the odd column selecting line redundancy enable signal generating portion 149 shown in FIG. 1. Referring to FIG. 7, the odd column selecting line redundancy enable signal generating portion 149 receives the bits CA1 through CA7 of the column address input from the outside, the inverted bits CA1B through CA7B of the bits CA1 through CA7, and the power voltage sensing signal PVCCH, and generates the redundancy enable signal RENi for activating the redundancy memory cell (not shown).

The circuit shown in FIG. 6 is the same as the circuit shown in FIG. 7 except the fact that the even column selecting line redundancy enable signal generating portion 147 shown in FIG. 6 receives the bits ECA1 and ECA2 generated from the inverting decoder 151 of FIG. 1 and the inverted bits ECA1B and ECA2B of the bits ECA1 and ECA2. However, the odd column selecting line redundancy enable signal generating portion 149 shown in FIG. 7 receives the less significant bits CA1 and CA2 of the column address input from the outside and the inverted bits CA1B and CA2B of the less significant bits CA1 and CA2. Therefore, the circuit shown in FIG. 7 will not be described.

Figure 8:
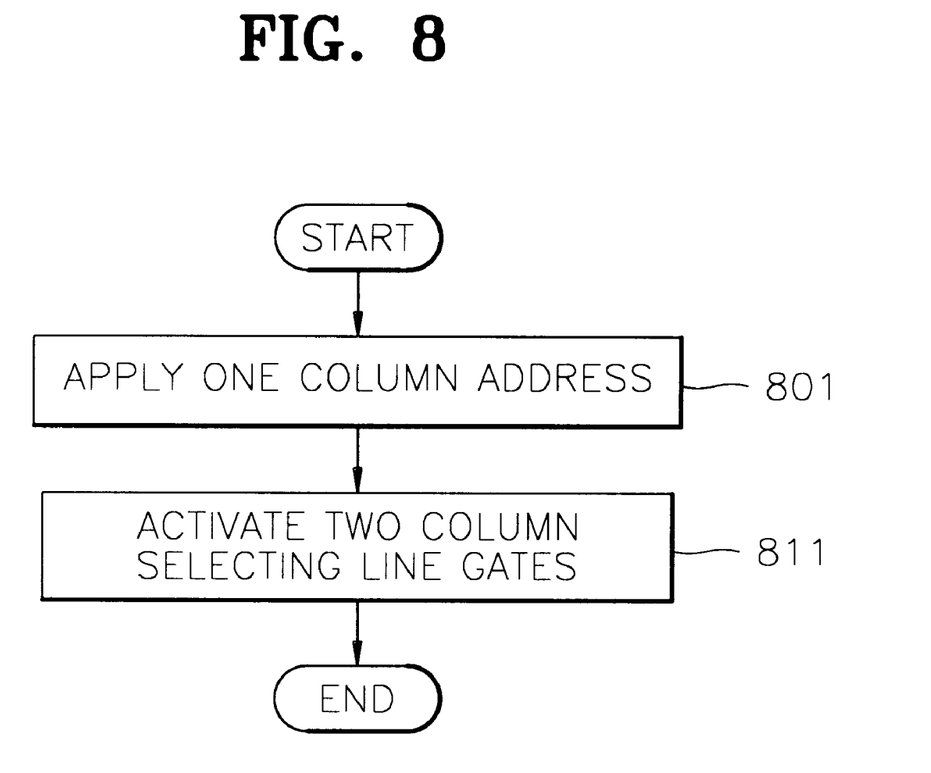
FIG. 8 is a flowchart illustrating a column address decoding method of a semiconductor memory device according to a preferred embodiment of the present invention.

FIG. 8 is a flowchart showing a method of decoding the column address of the semiconductor memory device according to the present invention. Referring to FIG. 8, the method of decoding the column address of the semiconductor memory device includes first and second steps 801 and 811. The method of decoding the column address of the semiconductor memory device according to the present invention will be described with reference to FIG. 1.

In the first step 801, the column address CAi is applied from the outside to the predecoder 131 and the main decoder 141. In the second step 811, the column selecting line designated by the column address CAi, and the column selecting line designated by the address next to the column address CAi are simultaneously activated by decoding the column address CAi. When the redundancy memory cell is used since the memory cell connected to the column selecting line designated by the address next to the column address CAi is poor, the address next to the column address CAi generated in the second step 811 is inversely decoded. The redundancy enable signal RENi is generated by the inversely decoded address. The column selecting line connected to the redundancy memory cell is activated by the redundancy enable signal RENi.

As mentioned above, the data processing speed of the semiconductor memory device is increased by inputting one column address CAi to the semiconductor memory device and simultaneously activating the two column selecting lines.

According to the present invention, when one of the column addresses CAi or CAj is input to the semiconductor memory device, the column selecting line designated by the column address and the column selecting line designated by the address next to the column address are simultaneously activated. Therefore, the data processing speed is increased by simultaneously storing two items of data in the memory cell array 101 or simultaneously reading two data items from the memory cell array 101.

Optimal embodiments are provided in the drawings and the specification. The present invention is not restricted to the above embodiments and it is clearly understood that many variations are possible within the scope and spirit of the present invention by anyone skilled in the art.

What is claimed is:

1. A semiconductor memory device, comprising:
   a memory cell array including a plurality of memory cells for storing data;
   a plurality of bit line pairs connected to the memory cells;
   a plurality of input and output line pairs;
   a plurality of switching means connected between the bit line pairs and the input and output line pairs; and
   an address decoder for decoding addresses received as input from the outside, simultaneously activating at least two switching means among the plurality of switching means, and electrically connecting corresponding bit line pairs and input and output line pairs, said address decoder comprising a predecoder for predecoding the address and a main decoder for decoding the predecoded address output from the predecoder and selecting the switching means from the plurality of switching means;
   wherein the predecoder comprises an even predecoder for receiving the less significant bits of the address and predecoding the less significant bits when the least significant bit is a logic 0, an odd predecoder for receiving the less significant bits of the address and predecoding the less significant bits when the least significant bit is a logic 1 and a main predecoder for predecoding the more significant bits of the address.

2. The semiconductor memory device of claim 1, wherein the plurality of switching means are connected to column selecting lines.

3. The semiconductor memory device of claim 1, wherein the address decoder simultaneously activates switching means designated by the address, and switching means designated by the address next to the address.

4. The semiconductor memory device of claim 1, wherein the address decoder is a column address decoder for selectively designating the bit line pairs.

5. The semiconductor memory device of claim 1, wherein the even predecoder further receives as an input a burst length signal, combines the burst length signal with the less significant bits of the address, and predecodes the address.

6. The semiconductor memory device of claim 1, wherein the main decoder comprises:
- a first decoder for decoding the address predecoded by the even predecoder and the address predecoded by the main predecoder and activating one of the column selecting lines; and
- a second decoder for decoding the address predecoded by the odd predecoder and the address predecoded by the main predecoder and activating one of the column selecting lines which are not activated by the first decoder.

7. The semiconductor memory device of claim 6, wherein the first decoder activates one of the even column selecting lines and the second decoder activates one of the odd column selecting lines.

8. The semiconductor memory device of claim 1, wherein the semiconductor memory device is a synchronous DRAM semiconductor device.

9. A semiconductor memory device, comprising:
- a memory cell array including a plurality of memory cells for storing data and redundancy memory cells for replacing poor memory cells among the memory cells;
- a plurality of bit line pairs connected to the memory cells;
- a plurality of input and output line pairs;
- a plurality of switching means connected between the bit line pairs and the input and output line pairs;
- an even predecoder for receiving as an input the less significant bits of the address input from the outside and predecoding the less significant bits when the least significant bit is in a first logic state;
- an inverting decoder for reproducing the less significant bits of the external address corresponding to the address predecoded by the even predecoder; and
- a redundancy enable signal generating portion for generating a redundancy enable signal and receiving the output of the inverting decoder.

10. The semiconductor memory device of claim 9, wherein the inverting decoder comprises:
- a plurality of switching means for reproducing the less significant bits of the external address in response to the addresses predecoded by the even predecoder; and
- a plurality of latches for latching the less significant bits of the external address.

11. The semiconductor memory device of claim 10, wherein the plurality of switching means are transmission gates.

12. An integrated circuit memory device, comprising:
- an address predecoder that generates predecoded address signals in response to an applied address, said address predecoder comprising an even predecoder, an odd predecoder and a main predecoder; and
- a main decoder that receives the predecoded address signals, said main decoder comprising:
  - an even decoder that receives predecoded address signals generated by the even predecoder and the main predecoder; and
  - an odd decoder that receives predecoded address signals generated by the odd predecoder and the main predecoder.

13. The memory device of claim 12, wherein said main decoder further comprises an inverting decoder that receives predecoded address signals generated by the even predecoder.

14. The memory device of claim 12, wherein the even decoder comprises an even redundancy enable signal generator; and wherein the odd decoder comprises an odd redundancy enable signal generator.

15. The memory device of claim 13, wherein the even decoder comprises an even redundancy enable signal generator; and wherein the odd decoder comprises an odd redundancy enable signal generator.

16. The memory device of claim 15, wherein the even redundancy enable signal generator receives address signals generated by the inverting decoder.

17. The memory device of claim 16, wherein the even redundancy enable signal generator receives a most significant portion of the applied address, but not a least significant portion of the applied address; and wherein the odd redundancy enable signal generator receives the least significant portion of the applied address and the most significant portion of the applied address.

18. The memory device of claim 17, wherein the even predecoder and the odd predecoder receive the least significant portion of the applied address; and the main predecoder receives the most significant portion of the applied address.

19. The memory device of claim 18, wherein the applied address is a column address; and wherein said main decoder generates a plurality of column select signals on column select signal lines.

20. The memory device of claim 19, further comprising:
- a memory cell array electrically coupled to a plurality of bit lines;
- a plurality of input/output lines; and
- a plurality of pass transistors that selectively electrically connect respective ones of the plurality of bit lines to respective ones of the plurality of input/output lines, in response to the column select signals.

21. The memory device of claim 12, wherein the even predecoder is responsive to a burst length signal.

22. An integrated circuit memory device, comprising:
- an address predecoder that generates predecoded address signals in response to an applied address and a burst length signal; and
- a main decoder that generates column select signals in response to the predecoded address signals and comprises an inverting decoder that is responsive to at least one of the predecoded address signals and a redundancy enable signal generator that receives address signals generated by the inverting decoder.

* * * * *